United States Patent
Bickford et al.

(10) Patent No.: US 9,536,796 B2
(45) Date of Patent: Jan. 3, 2017

(54) MULTIPLE MANUFACTURING LINE QUALIFICATION

(71) Applicant: INTERNATIONAL BUSINESS MACHINES CORPORATION, Armonk, NY (US)

(72) Inventors: Jeanne P. Bickford, Essex Junction, VT (US); Kevin K. Dezfulian, Mount Kisco, NY (US); Erik L. Hedberg, Essex Junction, VT (US)

(73) Assignee: GLOBALFOUNDRIES INC. (KY)

( * ) Notice: Subject to any disclaimer, the term of this patent is extended or adjusted under 35 U.S.C. 154(b) by 896 days.

(21) Appl. No.: 13/732,932

(22) Filed: Jan. 2, 2013

(65) Prior Publication Data

US 2014/0188266 A1    Jul. 3, 2014

(51) Int. Cl.
  H01L 21/02    (2006.01)
  H01L 21/66    (2006.01)

(52) U.S. Cl.
  CPC ............... *H01L 22/12* (2013.01); *H01L 22/14* (2013.01); *H01L 22/20* (2013.01); *H01L 22/34* (2013.01); *H01L 2924/0002* (2013.01)

(58) Field of Classification Search
  CPC ....................................................... H01L 21/02
  USPC ...................... 700/121; 716/106; 324/762.06
  See application file for complete search history.

(56) References Cited

U.S. PATENT DOCUMENTS

| | | |
|---|---|---|
| 5,383,132 A | 1/1995 | Shinohara et al. |
| 6,365,422 B1 | 4/2002 | Hewett et al. |
| 6,379,848 B1 | 4/2002 | McMullen |
| 6,720,194 B1 | 4/2004 | Miller et al. |
| 6,986,280 B2 | 1/2006 | Muckenhirm |
| 7,385,864 B2 | 6/2008 | Loh et al. |
| 7,650,946 B2 | 1/2010 | Gazewood |
| 7,653,888 B2 | 1/2010 | Habib et al. |
| 7,736,916 B2 | 6/2010 | Aghababazadeh et al. |
| 7,962,234 B2 | 6/2011 | Song et al. |
| 7,966,087 B2 | 6/2011 | Kokotov et al. |
| 2004/0169861 A1 | 9/2004 | Mieher et al. |
| 2005/0195398 A1 | 9/2005 | Adel et al. |
| 2008/0018356 A1 | 1/2008 | Anand et al. |
| 2008/0231307 A1 | 9/2008 | Bickford et al. |
| 2009/0039912 A1 | 2/2009 | Bickford et al. |
| 2009/0070722 A1 | 3/2009 | Bickford et al. |
| 2009/0210201 A1 | 8/2009 | Bickford et al. |
| 2010/0253382 A1 | 10/2010 | Wang et al. |
| 2013/0120739 A1 | 5/2013 | Dai et al. |

OTHER PUBLICATIONS

Gattiker et al. "Data Analysis Techniques for CMOS Technology Characterization and Product Impact Assessment," IEEE International Test Conference, 2006, ITC '06, Oct. 2006, 10 pages.

(Continued)

*Primary Examiner* — Tejal Gami
(74) *Attorney, Agent, or Firm* — David Cain; Andrew M. Calderon; Roberts Mlotkowski Safran Cole & Calderon, P.C.

(57) ABSTRACT

Methods and systems for multiple manufacturing line qualification are provided. A method includes establishing a product template and producing products on one or more manufacturing lines. The products include product macros placed on a chip. The method also includes establishing allowed parametric match from line to line. The method further includes determining that products from the one or more manufacturing lines meet the allowed parametric match.

17 Claims, 8 Drawing Sheets

(56) References Cited

OTHER PUBLICATIONS

Steinbrueck et al. "Non-Contact, Pad-less Measurement Technology and Test Structures for Characterization of Cross-Wafer and In-Die Product Variability," IEEE International Conference on Microelectronic Test Structures, 2009, ICMTS 2009, pp. 91-95.
Bickford et al. "Use of Scalable Parametric Measurement Macro to Improve Semiconductor Technology Characterization and Product Test," 2010 11th International Symposium on Quality Electronic Design (ISQED), Mar. 22-24, 2010, pp. 315-319.
Office Action for U.S. Appl. No. 13/732,708 dated Jun. 3, 2015, 26 pages.
IBM, Method to qualify primary and follow on semiconductor manufacturing sources using an on-chip parametric monitor like the Scalable Parametric Measurement Macro. Jun. 12, 2007, IP, IP No. 000153869, 4 pages.
D. Boolchandani, Lokesh Garg, Sapna Khandelwal and Vineet Sahula, Variability Aware Yield Optimal Sizing of Analog Circuits using SVM-Genetic Approach, IEEE, Symbolic and Numerical Methods, Modeling and Applications to Circuit Design (SM2ACD), 2010 XIth International Workshop, 6 pages.
Office Action for U.S Appl. No. 13/732,708 dated Feb. 24, 2016, 38 pages.
Notice of Allowance in related U.S. Appl. No. 13/732,708 dated Sep. 1, 2016, 16 pages.

though these products do not necessarily operate in the same manner. Products designed with the same design system are expected to match the outcome predicted by the design system and are subject to the same issues as a common product manufactured in multiple manufacturing lines.

MULTIPLE MANUFACTURING LINE QUALIFICATION

FIELD OF THE INVENTION

The invention relates to semiconductor devices and, more particularly, to systems and methods for multiple manufacturing line qualification.

BACKGROUND

Process variation is an increasingly important factor in the design of high yielding and high-performance ICs. Manufacturing lines use scribe line parametric measurement macros to measure technology parameters such as threshold voltages, resistances, currents, oxide thickness, resistance, capacitance, and composite measurements. The measurements obtained from scribe line parametric measurement macros are affected by other macros placed close to the scribe line (proximately effects). Different manufacturing lines use different scribe line measurement macros. Since the same product or a set of products produced from a common design system are manufactured in multiple lines, the capability to match performance, power, and functionality between multiple manufacturing lines is needed. Controls are needed so that the output of the multiple lines results in the same outcome (power, performance, functionality, etc.) when said products are used in systems.

Process variation in IC fabrication is the deviation from intended or designed values for a structure or circuit parameter of concern. Process variation can result in the fluctuation of parameter values and dimensions in both the structural device and interconnect levels, which can influence performance of ICs.

Conventionally, manufacturing lines use embedded devices in the scribe line of a semiconductor to verify that products meet specifications. The embedded devices can be tested during the manufacturing process and measurements taken from the devices can be compared to technology design rules. Scribe line measurement structures are affected by design of the structure and placement within the scribe line (use of fill shapes, proximity to adjacent structures, etc.). Scribe line measurements are used as product acceptance criteria in many foundry engagements. Since each manufacturing line may use different scribe line structures, the same product design manufactured in multiple manufacturing lines using the same design rule specification can create product that has different functionality, performance, and power.

However, this can result in product that differs substantially in the end system application. As such, different measurement structures embedded in the product die are also used to test a product manufactured in one manufacturing line and to determine that the final product meets functionality, performance, and power requirements. As a result, it is difficult to qualify multiple manufacturing lines to produce the same product with equivalent functionality, power, performance, and yield even when the same technology design rules are applied.

Moreover, the use of conventional scribe line test structures to qualify a manufacturing process line does not guarantee that a product is operable. Conventional manufacturing processes test products using a scribe line test structure, and when the final products are compliant with expected measurements, the final products are distributed to customers. However, the same products produced on different manufacturing lines differ from one another. More specifically, a product design can be manufactured on several different manufacturing lines, but due to process variations on these manufacturing lines, the products are not identical. As a result, these products do not necessarily operate in the same manner. Products designed with the same design system are expected to match the outcome predicted by the design system and are subject to the same issues as a common product manufactured in multiple manufacturing lines.

Accordingly, there exists a need in the art to overcome the deficiencies and limitations described hereinabove.

SUMMARY

In a first aspect of the invention, the method comprises: designing a product with technology design rules, designing and placing substantially identical parametric test macros within the product chip and scribe line, qualifying the product in a first manufacturing line to meet established application criteria for function, power, and performance, establishing a template of product parametric criteria as measured on the product test macros, and establishing scribe line limits consistent with the product parametric criteria.

In a further aspect of the invention, the method comprises qualifying the same product in a second (or additional) manufacturing line by: producing the same product with substantially identical embedded product and scribe line test macros in a second (or additional) manufacturing line, measuring the product parametric test macros, comparing the measurements to the product template, adjusting the manufacturing process to match the product template, and setting scribe line limits that are consistent with the product template.

In yet another aspect of the invention, a computer system for qualifying multiple manufacturing lines comprises a CPU, a computer readable memory and a tangible computer readable storage media. The computer system comprises first program instructions to establish a product template. The computer system also comprises second program instructions to manufacture products on one or more manufacturing lines. The computer system further comprises third program instructions to establish allowed parametric match from line to line. The computer system comprises fourth program instructions to determine that products from the one or more manufacturing lines meet the allowed parametric match. The first, second, third, and fourth program instructions are stored on the computer readable storage media for execution by the CPU via the computer readable memory.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
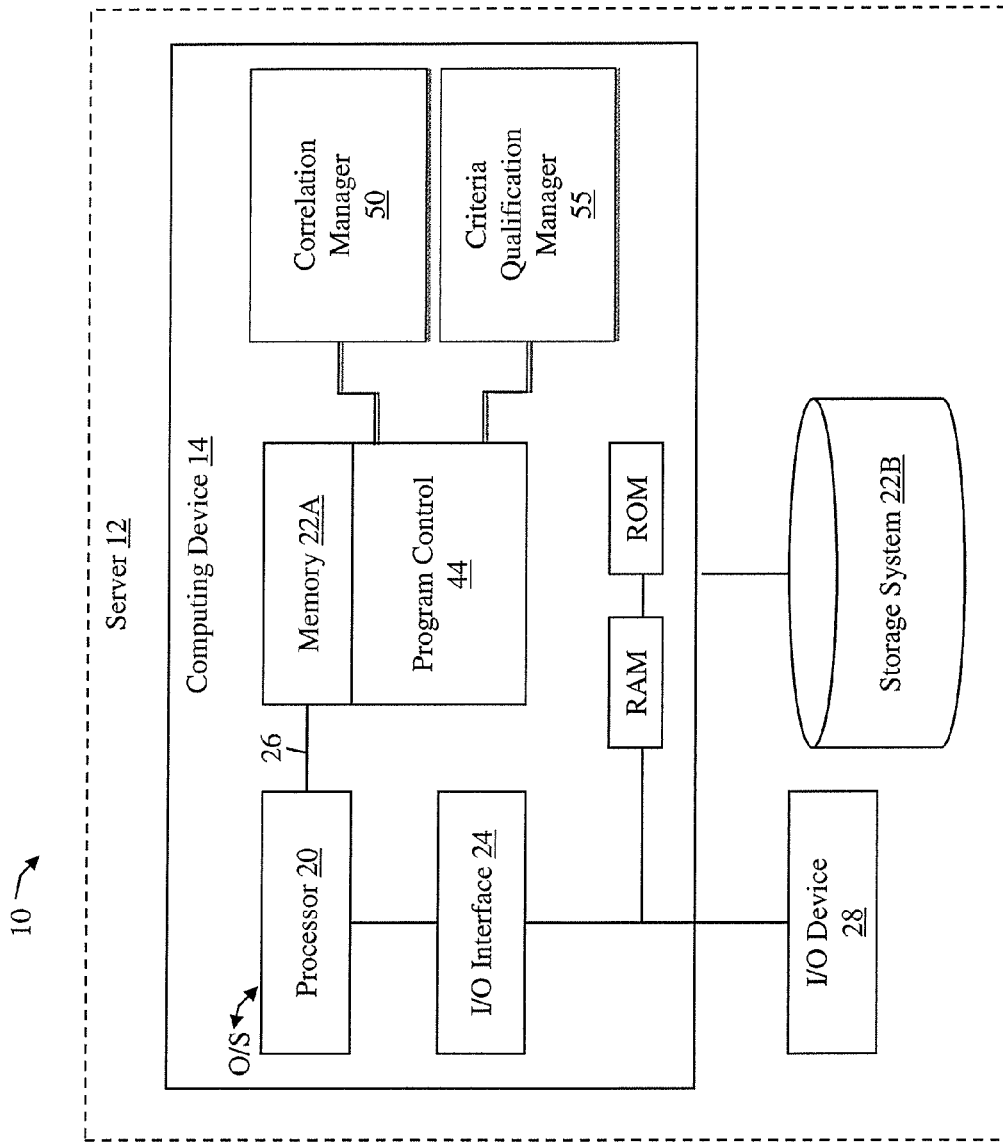
FIG. 1 shows an illustrative environment for implementing steps in accordance with aspects of the present invention.

The invention relates to semiconductor devices and, more particularly, to systems and methods to create substantially identical output for the same semiconductor products or a set of semiconductor products designed with a common design system when said products are produced in multiple manufacturing lines. The present invention can be used to advantageously place product parametric disposition macros in product chips and create scribe line parametric disposition macros, e.g., the macros used in the product chips can be used to adjust parameters in a second (or additional) manufacturing line such that the functionality, power, and performance in a second (or additional) manufacturing line match the output of a first manufacturing line. In this way, the present invention can be used to achieve the same functionality, power, and performance from two or more manufacturing lines.

Embodiments of the present invention also advantageously provide manufacturing line centering in a first manufacturing line by placing substantially identical parametric measurement macros in both the product and the scribe line, identify product disposition macro/scribe line parametric macro offset in a first manufacturing line, adjusting the process and the scribe line disposition criteria in the first manufacturing line such that the first manufacturing line produces output that meets line and or product qualification specifications. A parametric template (for the product parametric disposition macro) is created for each product and/or design system products produced in the first manufacturing line. The identical product disposition macro is located in the product and/or design system to be produced in the second (or additional) manufacturing line and a substantially identical scribe line measurement macro is placed in the scribe line of the product being manufactured in the second (or additional) manufacturing line.

As a result, embodiments of the present invention can be used to adjust the manufacturing process in a second (or additional) manufacturing line to match the parametric template from the first manufacturing line such that the functionality, power, and performance for products produced in both (or all) manufacturing lines are identical or substantially identical. After the process is adjusted in the second manufacturing line such that the parametric template in the second (or additional) line matches that of the first manufacturing line, the scribe line control limits for the second line (or additional line) is set such that the scribe line measurement macro will keep the manufacturing line process centered to produce product(s) with product disposition macros that match the product template established in the first manufacturing line.

In this way, the present invention can be used to apply a parametric template of required parametric distribution for measurement macros located inside a product die in a first manufacturing line and to ensure that multiple manufacturing lines have a common parametric footprint. More specifically, in embodiments, qualification criteria can be established based on the template and different manufacturing lines can be qualified using the qualification criteria. Accordingly, embodiments of the present invention can be used to ensure that products manufactured on different manufacturing lines have a common parametric footprint with products manufactured on the manufacturing line used to produce the template. That is, according to aspects of the present invention, products from different manufacturing lines can be qualified based on a product template from a first manufacturing line. Thus, embodiments of the present invention can be used to determine that product die manufactured on different manufacturing lines meet the qualification criteria from a first manufacturing line.

Moreover, according to aspects of the present invention, the product die parametric template can be used to set accept/reject criteria for wafers from each manufacturing line. Additionally, criteria analysis can be conducted to proactively predict yield loss, which can be used to stop wafer production and prevent unnecessary consumption of resources. As a result, embodiments of the present invention ensure that product meeting the accept/reject criteria will meet product test criteria and avoid yield loss. Furthermore, in aspects of the present invention, the product disposition macros in the products and the scribe line can be used to diagnose yield, performance, and functionality for each manufacturing line.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server 12 or other computing system that can perform the processes described herein. In particular, the server 12 includes a computing device 14. The computing device 14 can be resident on a network infrastructure or computing device of a third party service provider (any of which is generally represented in FIG. 1).

The computing device 14 includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with an external I/O device/resource 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls a correlation manager 50 and a criteria qualification manager 55 that are configured to perform the processes described herein. For example, the correlation manager 50 can correlate measurements taking during a manufacturing process with final product measurements. More specifically, the correlation manager 50 can be used to correlate measurements taken at each processing step in a scribe test structure and measurements taken on a final product. Even more specifically, the correlation manager 50 can be used to generate an estimation correlation line, e.g., a regression line, which indicates the correlation between the in-line manufacturing measurements and the final product measurements.

Accordingly, the present invention can be used to correlate a final product structure to a manufacturing base structure, and identify the processing step(s) which cause defects in the final product or to validate the in-line manufacturing processes. As a result, according to aspects of the present invention, when the final product is compromised, the processing steps causing the defects can be rectified or a new product design can be developed. For example, the present invention can be used to identify defects due to regional proximity effects, i.e., when a density of devices in a product and/or scribe effect performance of the product. In this way, the correlation manager 50 can be used to adjust the manufacturing process or product design. For example, in embodiments, adjustments can include relocating devices to alleviate regional proximity effects, changing a width of a poly-line, adjusting heat/temperature settings, and/or modifying a tool at a particular processing step.

Furthermore, using the correlation manager 50, the present invention can be used to predict a yield loss of a wafer, e.g., 10% or 50% of the products will be defective. In this way, the present invention can be used to proactively stop production before further processing steps are completed, thus prevent unnecessary consumption of resources. More specifically, by predicting the yield loss, a chip design can be modified prior to a wafer lot going into production.

Moreover, the criteria qualification manager 55 can be used to establish a product template based on the re-centered manufacturing process or design model. In this way, the product template can be used to qualify products manufactured on a second (or more) manufacturing line. That is, the qualification manager 55 can be used to compare products manufactured on different manufacturing lines with the product template, and determine that products manufactured on the different manufacturing lines have a common parametric footprint. More specifically, product measurements can be taken from the products manufactured on the different manufacturing lines using the macros, as described herein, and compared to the product template. In embodiments, when the product measurements on the second (or more) manufacturing line does not meet the qualification criteria, the manufacturing process of the second (or more) manufacturing line can be re-centered using the processes of the present invention. In embodiments, when the product measurements meet the qualification criteria, the final product manufactured on the second (or more) manufacturing line can be approved and provided to customers.

The correlation manager 50 and the criteria qualification manager 55 can be implemented as one or more program code in the program control 44 stored in memory 22A as separate or combined modules. Additionally, the correlation manager 50 and the criteria qualification manager 55 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
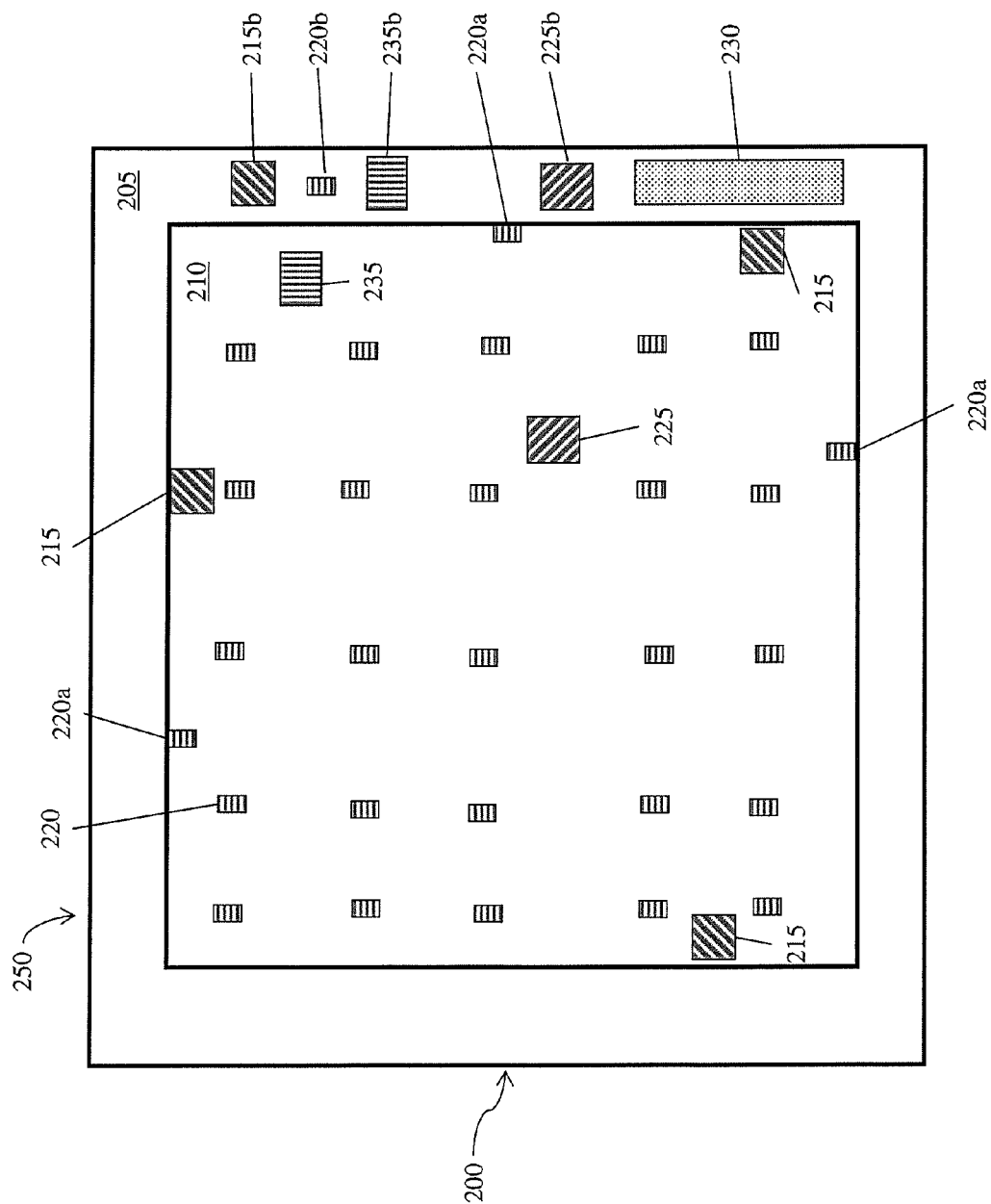
FIG. 2 shows a design layout for monitoring a product in accordance with aspects of the present invention.

FIG. 2 shows a design layout 250 for monitoring a product in accordance with aspects of the present invention. FIG. 2 represents an illustration of an exemplary layout of test macros. However, alternate layouts are contemplated by the present invention.

More specifically, FIG. 2 shows a layout 250 of a wafer 200 that includes a chip 210 surrounded by a scribe line 205 (also referred to as a kerf). The layout 250 includes a plurality of parametric test macros (215, 220, 225, and 235). According to aspects of the invention, one or more instances of the parametric test macro designs 215b, 220b, 225b, 235b are placed within the scribe line 205. The design and placement of parametric test macros within the chip 210 and scribe line 205 is an aspect of the present invention that may be optimized for the likely sources of variation in a given technology or product design and the cost in design resources, chip and scribe line area, and test and characterization time and capacity.

In embodiments, the layout 250 includes a plurality of performance screen ring oscillators (PSRO) 215 placed on the chip 210. A PSRO acts as a free-running ring of latching stages passing a pulse. The periodicity of the PSRO output provides a relative indication of the speed of the circuit stage, i.e., a short period means a faster circuit speed. The delay of one or more PSRO circuits is commonly used to gauge the circuit performance of the product chip as a whole and to screen out parts that lie outside an acceptable range of values.

More specifically, as shown in FIG. 2, an exemplary design layout 250 includes three edge PSROs 215 placed on the chip 210. In embodiments, the edge PSROs can include multiple circuit topologies built from devices of multiple target threshold voltages and design widths, as would be understood by those of ordinary skill in the art. Although FIG. 2 shows the design layout 250 having three edge PSROs 215, it should be understood that the number of edge PSROs 215 is used for exemplary purposes and that more or less edge PSROs 215 are contemplated by the present invention.

The exemplary design layout 250 further includes a plurality of distributed PSROs 220. For example, as shown in FIG. 2, the design layout 250 includes 25 distributed PSROs 220. In embodiments, the design layout 250 can include a predetermined number (e.g., 25) of the distributed PSROs 220 built across the chip 210 in different configurations. For example, the distributed PSROs 220 may be placed across the chip 210 in substantially a grid type format (e.g., with a predetermined periodicity). More specifically, in embodiments, 25 distributed PSROs 220 are provided on the chip 210 in a 5×5 grid. Additionally, in embodiments, the layout 250 may also include outlying distributed PSROs 220a near the scribe line 205 of the chip 210 depending on the placement of active regions of the chip 210. More specifically, three distributed PSROs 220a can be provided within a designated distance from the edge of the chip 210. In addition, a substantially identical distributed PSRO 220b is provided in the scribe line 205. Although FIG. 2 shows the design layout 250 having 25 distributed PSROs 220 formed in a 5×5 grid and three distributed PSROs 220a and one distributed PSRO 220b in the scribe line, it should be understood that the number of distributed PSROs is used for exemplary purposes and that more or less distributed PSROs are contemplated by the present invention.

In embodiments, a range of values for the measurements of the distributed PSROs (220, 220a), e.g., a minimum value and a maximum value, can be established and/or an average value can be determined. In this way, the correlation can be made between any measurement point in the manufacturing line in the scribe line 205 and the range and/or the average value. That is, according to aspects of the present invention, the range of values and/or the average values of the distributed PSROs (220, 220a) on the chip 210 can be compared to the measurements taken at the distributed PSRO 220b in the scribe line 205.

In implementation, a manufacturer may monitor the measurements of the PSROs (220, 220a, 220b) on the chip 210 and in the scribe line 205, and such measurements can be compared to known test data to optimize wafer yields based on, for example, the chip-mean circuit delay. That is, measurements can be taken in the scribe line 205 after one or more wiring levels are formed and on the chip 210 at the final wafer test. A manufacturer can then compare in-line measurements taken from the distributed PSROs 220b in the scribe line 205 with the measurements, e.g., the range and/or average values, of the distributed PSROs (220, 220a) on the chip 210. Using this comparison, a manufacturer can determine that collections of chips, wafers, or manufacturing lots meet the specification limits and as necessary, adjust the manufacturing process to optimize the yield of parts to those specification limits.

In embodiments, as shown in FIG. 2, the design layout 250 includes statistical process monitors (SPM) 225. These SPMs 225 can be a collection of test macros that measure electrical properties (e.g., device threshold voltage and drive current) for individual N-type and P-type devices. The design of these devices (SPMs 225) may vary by target threshold voltage, gate length, diffusion width, etc. When embedded within a product design, the output of an SPM can be wired out to a reserved output pin. More specifically, in embodiments, an SPM 225 is provided in the scribe line 205 and on the chip 210. In embodiments, the SPMs 225 can be used to establish process-induced offsets in the electrical characteristics of individual devices between the scribe line 205 and the chip 210.

Furthermore, in embodiments, the design layout 250 includes manufacturing kerf structures 230. In embodiments, the manufacturing kerf structures 230 can be used to measure one or more process characteristics (e.g., circuit delays and currents, device currents and threshold voltages, line and plate capacitances, line and plate resistances, film thickness, and critical dimensions). These measurements can be compared to established specification limits and used to adjust the manufacturing process to optimize yields to inline scribe line limits. In addition, the measurements taken on the final product, e.g., chip 210, can be compared with measurements taken from the manufacturing kerf test macros 230. In this way, a correlation can be made between product structures and the manufacturing kerf test macros 230. In this way, the manufacturing process can be further refined, as described herein.

In further embodiments, the design layout 250 can include a set of metal resistance and capacitance measurement macros 235. More specifically, as illustrated in FIG. 2, the metal resistance and capacitance measurement macros can be placed in the chip 210 and the scribe line 205. In embodiments, the metal resistance and capacitance measurement macros 235 can be used to determine that the final product meets predetermined qualification criteria. In this way, the final product can be approved and provided to customers.

Figure 3:
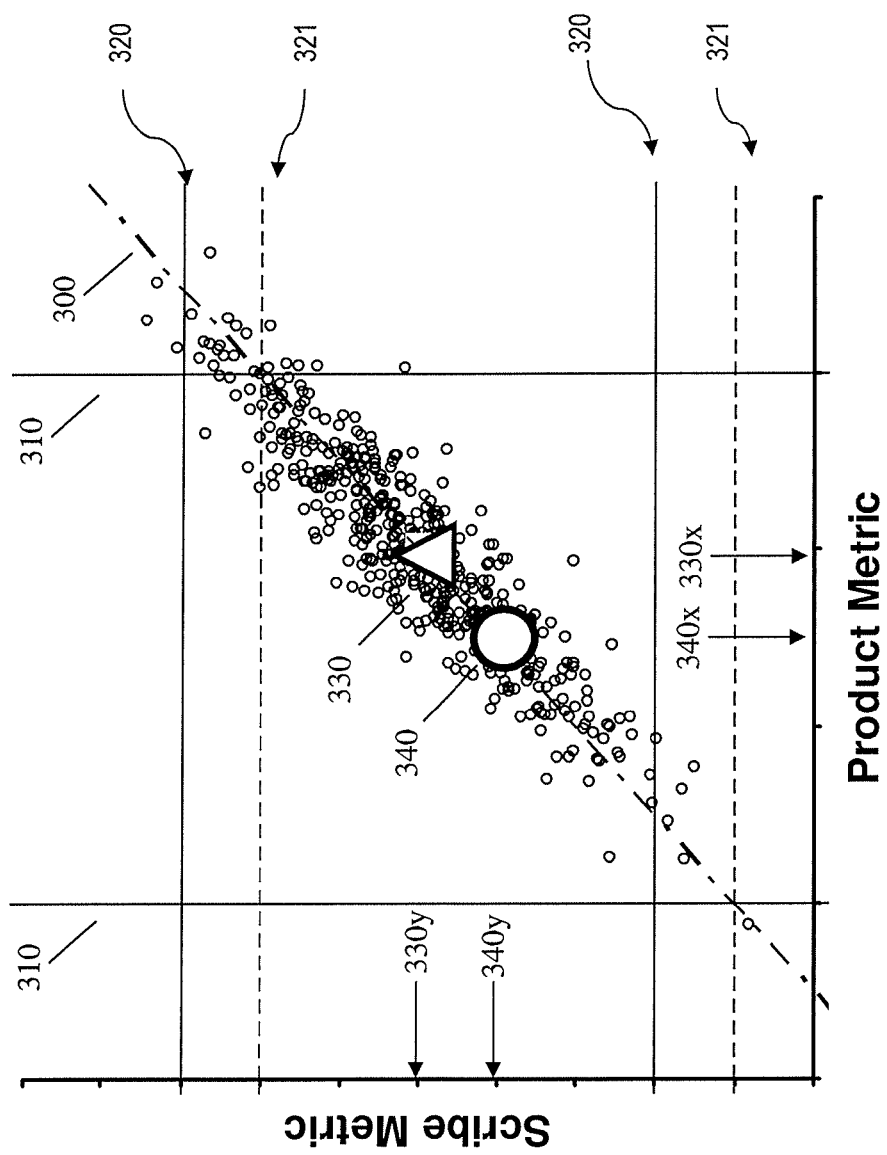
FIG. 3 shows a correlation plot of product and scribe line measurements with certain limits overlaid in accordance with aspects of the present invention.

FIG. 3 shows a correlation plot between scribe line measurements and product measurements in accordance with aspects of the present invention. The distribution of data points has a central (or average) value 330. Overlaid on the data points are initial scribe line specification limits 320. As could be readily determined by someone of ordinary skill in the art, the line center is optimal for yield to the initial scribe line limits 320. In particular, the scribe line data follow a normal distribution and the central scribe line value 330y are located midway between the initial scribe line limits 320.

Also overlaid on the plot in FIG. 3 are product screen limits 310. As could be determined by someone of ordinary skill in the art, the line center is not optimal for the product screen limits. In particular, the product data follow a normal distribution and the central product value 330x is substantially offset from the point 340x, located midway between the product screen limits 310.

In accordance with aspects of the present invention, an estimate correlation line 300 is overlaid on the plot. More specifically, FIG. 3 shows a regression line analysis, i.e., the estimate correlation line 300, between the scribe line measurements and the product measurements. FIG. 3 also illustrates a pair of empirical scribe line specification limits 321; each of which simultaneously intersect one of the intersection points between the correlation line 300 and the product screen limits 310.

In FIG. 3, point 340 has a scribe line measurement 330y located midway between the empirical scribe line limits 330 and also having a product measurement 340x located midway between the product screen limits 310. In accordance with aspects of the present invention, the point 340 is a line center that is optimum for yield to both empirical scribe line limits 321 and product screen limits 310. This is the line center target established through methods of the present invention.

Flow Diagrams

FIGS. 4-8 show exemplary flows for performing aspects of the present invention. The steps of FIGS. 4-8 may be implemented in the environment of FIG. 1, for example. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, or communicate the program for use by or in connection with the instruction execution system, apparatus, or device. The medium can be an electronic, magnetic, optical, electromagnetic, infrared, or semiconductor system (or apparatus or device). Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

Figure 4:
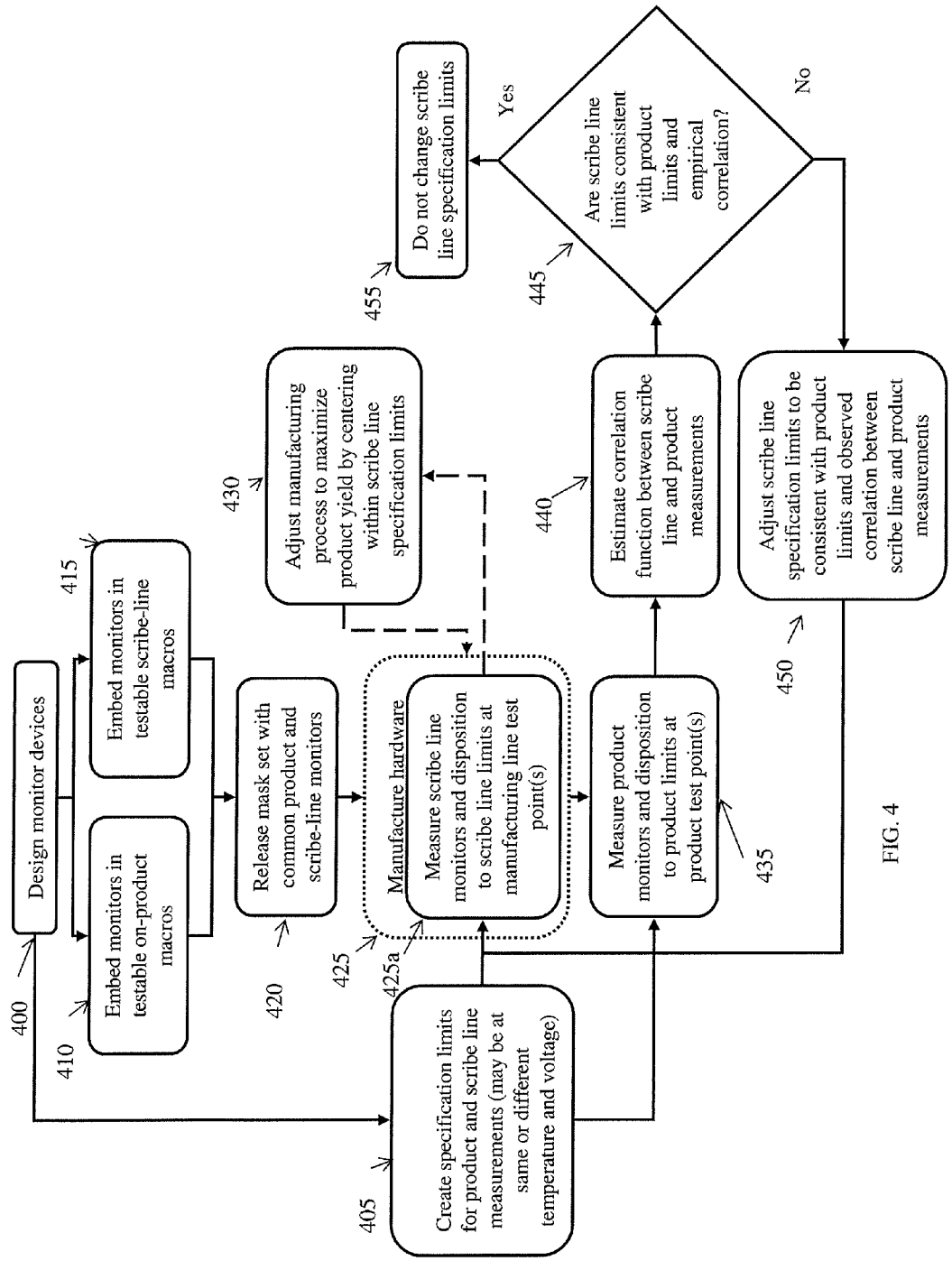
FIGS. 4-8 show exemplary flows for performing aspects of the present invention.

As shown in FIG. 4, at step 400, the process includes designing monitor devices. In embodiments, the monitor devices can be macros of products manufactured on a chip, as described herein. At step 405, specification limits for the product and scribe line measurements can be created. These specification limits can be at a same or different temperature and voltage as should be understood by those of ordinary skill in the art. The process further includes embedding the monitor devices in testable on-product structures at step 410 and testable scribe-line structures at step 415.

At step 420, the process can includes releasing a mask set with common product and scribe-line monitors. In this way, a product with the test structures described herein can be manufactured and used to re-center the manufacturing process. The process can include manufacturing hardware, e.g., a semiconductor wafer, at step 425, and measuring scribe-line monitors and dispositions to scribe-line limits at manufacturing line test point(s), as described herein, at step 425*a*. In embodiments, at step 430, the process can include adjusting a manufacturing process to maximize product yield by centering the manufacturing process within scribe line specification limits, and then reverting to step 425.

At step 435, the process further includes measuring product monitors and dispositions to determine product limits at product test point(s). The process can also include plotting scribe-line versus product measurements and determining an estimate correlation function, at step 440. At step 445, the process includes determining whether the scribe line specification limits are consistent with the product limits and the empirical correlation between scribe line measurements and product measurements, as described herein. When the scribe line specification limits are deemed inconsistent with the product limits and empirical data, the process includes adjusting the scribe line specification limits to be consistent with same at step 450. This may lead to further adjustment of the manufacturing process at step 430. When the scribe line specification limits are deemed consistent with the product limits and empirical data, the scribe line specification limits are not adjusted at step 455.

Figure 5:
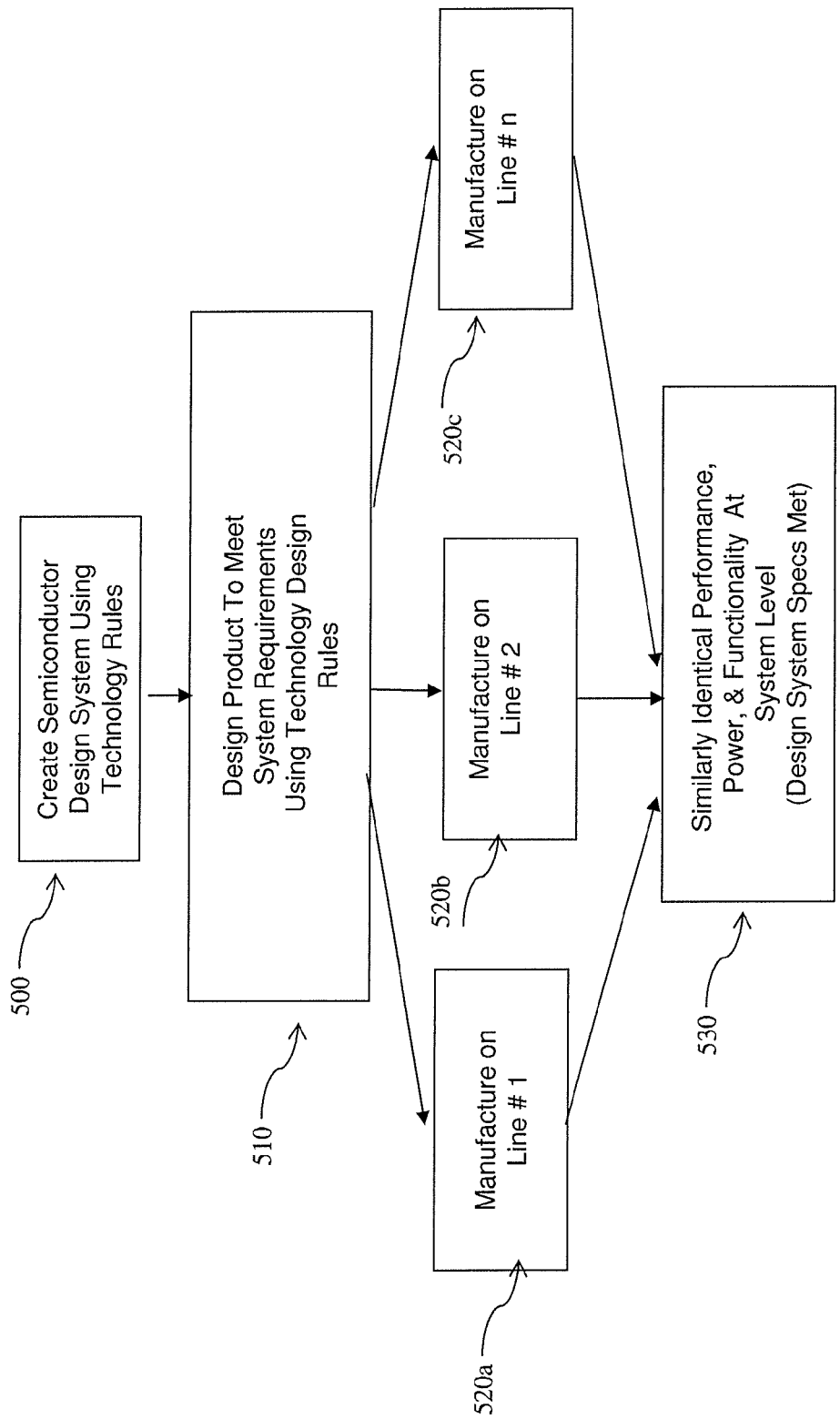

FIG. 5 depicts an exemplary flow for a process in accordance with aspects of the present invention where the same product is produced in multiple manufacturing lines. As shown in FIG. 5, at step 500, the process includes creating a design system using technology rules and designing a semiconductor product using a design system at step 510. Alternatively, products may be designed directly using technology rules (not using a design system). Products are manufactured in multiple manufacturing lines at steps 520*a*, 520*b*, and 520*c*. Output of all qualified manufacturing lines produces substantially identical output (power, performance, and functionality) at step 530 and meets all design system specification.

Figure 6:
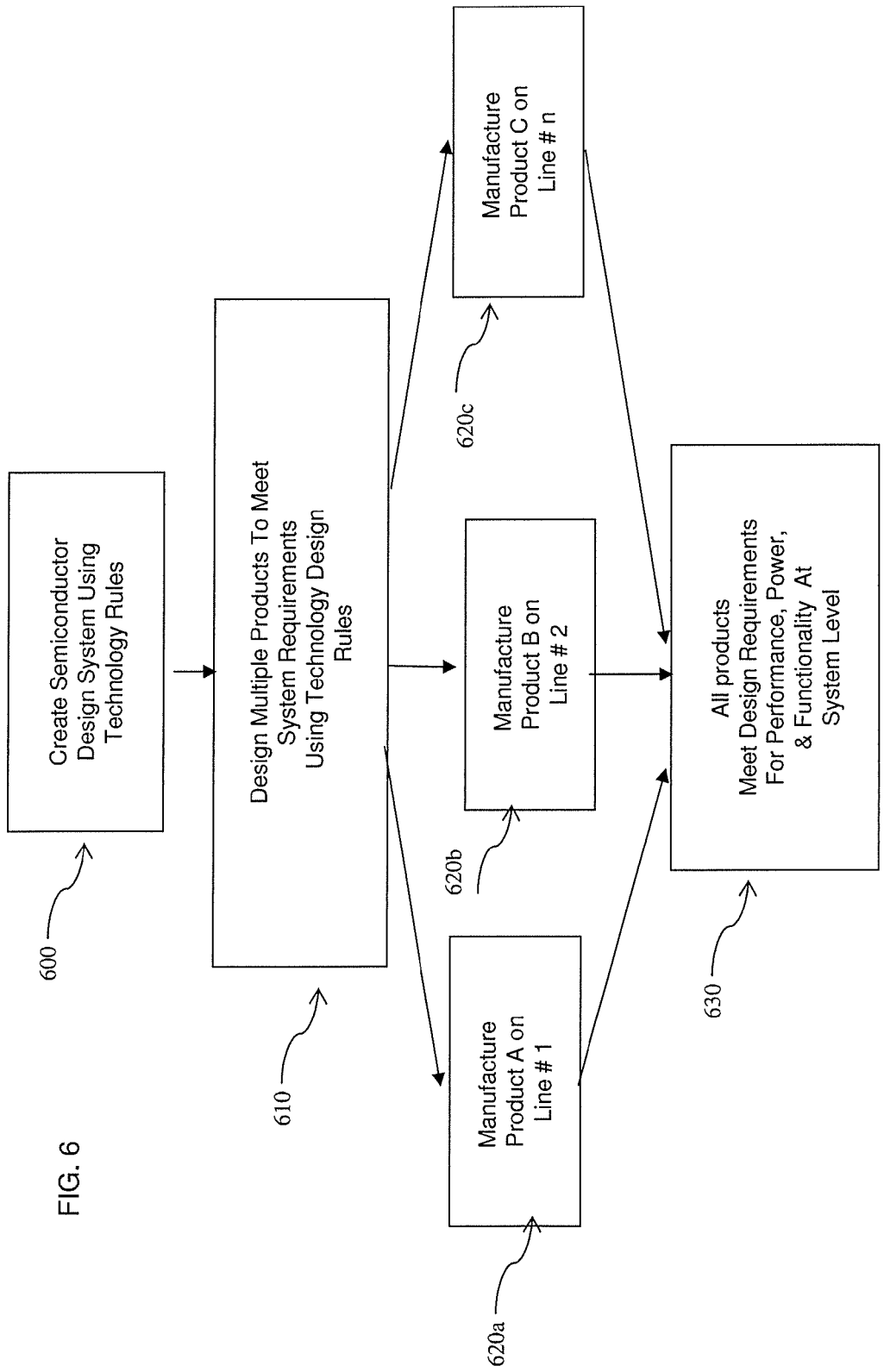

FIG. 6 depicts an exemplary flow for a process where multiple products designed with a common designing a system are manufactured in multiple manufacturing lines. As shown in FIG. 6, the process includes creating a design system using technology rules and designing a group of semiconductor products using a common design system at step 610. Different products are manufactured in the set of qualified manufacturing lines at steps 620*a*, 620*b*, and 620*c*. Output for all the products produced in all of the qualified manufacturing lines complies with system design specifications (power, performance, functionality) at step 630.

Figure 7:
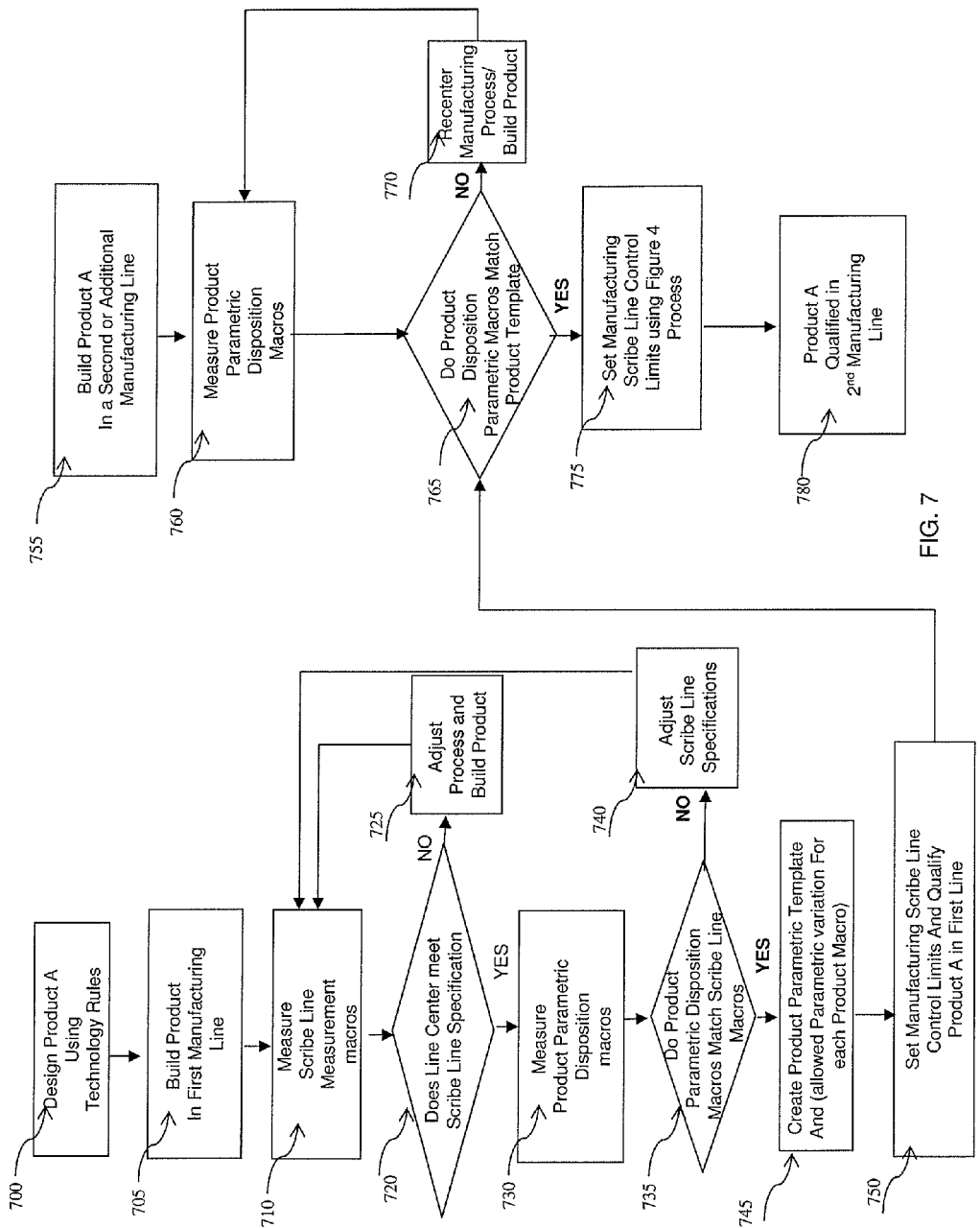

FIG. 7 depicts an exemplary flow to qualify a product in a second manufacturing line. The process shown in FIG. 7 can be used to qualify a group of products designed with a common design system by using a test chip instead of a product.

As shown at step 700, the process includes designing a semiconductor product using technology rules. Technology rules may be used directly or may be embedded in a design system. Product is built in a first manufacturing line at step 705. The scribe line measurement macros are measured at step 710, e.g., default scribe line. The line center is compared to the default scribe line specification at step 720. If the default scribe line specification is not met with the default process line center, the process is adjusted and additional product build is provided at step 725, is measured at step 710, and compared to default scribe line specifications at step 720. When the step 720 line center and scribe line match, the product parametric disposition macros are measured at step 730. If the product disposition macro results are not met with the scribe line macro settings at step 735, the scribe line specifications are adjusted at step 740, and the process repeats steps 710, 720, 730, and 735. When a match between product disposition macros and scribe line macros is obtained at step 735, the process proceeds to step 745 where a product parametric template and the allowed parametric variation for each product macro are determined. At step 750 the manufacturing scribe line control limits for this product in the first line are set, and the first line is qualified.

Qualification of the second manufacturing (or additional) line starts at step 755 where the same product build in the first line is built in a second manufacturing line. Product parametric measurement macros are measured in product manufactured in a second (or additional) manufacturing line at step 760, and at step 765 compared to the step 750 product template created from product parametric disposition measurements made on the product manufactured in the first manufacturing line. If the second (or additional) line has product parametric disposition macro results that do not match the template established at step 765, the manufacturing process is adjusted at step 770 and additional product is built until the results of the product template comparison at step 765 match.

If the step 765 comparison matches, product produced on both manufacturing lines will have equivalent functionality, performance, and power and the process proceeds to step 775 where scribe line measurement macros specifications are identified and implemented at step 780, the product is qualified in the second manufacturing line.

Figure 8:
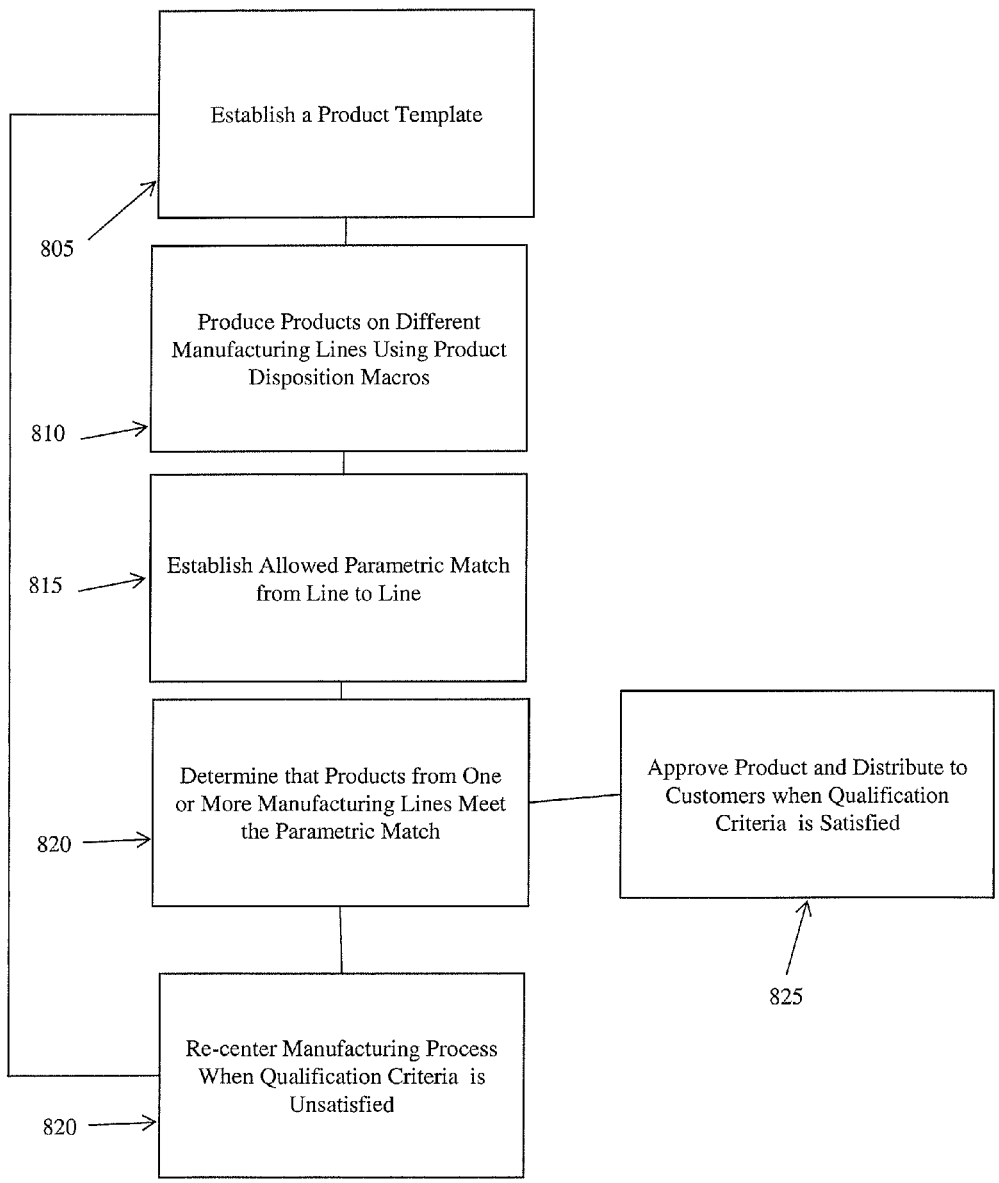

As shown in FIG. 8 at step 800, the process can include establishing a product template. More specifically, establishing a product template can include correlating measurements taken during a manufacturing process with final product measurements and re-centering a manufacturing process or design model, as described herein. At step 810, the process can also include producing products on one or more manufacturing lines. In embodiments, the products include the macros, as described with respect to FIG. 2. More specifically, the macros can include a plurality of edge PSRO on a chip and an edge PSRO in the scribe, a distributed PSRO on the chip and a distributed PSRO in the scribe, and a statistical process monitor (SPM) placed on the chip and a SPM placed in the scribe line, and manufacturing structures placed in the scribe line.

At step 815, the process further includes establishing allowed parametric match from line to line. More specifically, the allowed parametric match can include a design manual allowed mismatch, a scribe line to die allowed mismatch, and/or line to line allowed mismatch. At step 820, the process includes determining that products from the one or more manufacturing lines meet the allowed parametric match. More specifically, measurements can be taken from a product manufactured on the one or more manufacturing lines and compared to the product template. That is, the macros placed on the chip are compared to the macros placed on the chip of the product template to determine that the products manufactured on the one or more manufacturing lines have a common parametric footprint.

When the products from the one or more manufacturing lines meet the allowed parametric match, the products are approved and provided to customers, at step 825. In contrast, at step 830, when the products from the one or more manufacturing lines do not meet the allowed parametric match, the process includes re-centering the manufacturing process, as described herein. The process can then revert to step 805.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   establishing a product template created from product disposition measurements made on a product in a first manufacturing line and which qualifies products manufactured in one or more different manufacturing lines;
   producing products on the one or more different manufacturing lines, the products including product macros placed on a chip;
   establishing allowed parametric match from line to line which includes at least one of a design manual allowed mismatch, a scribe line to die allowed mismatch, and line to line allowed mismatch; and
   determining that products from the one or more different manufacturing lines meet the allowed parametric match by taking measurements from the products manufactured on the one or more manufacturing lines and comparing with macros placed on the product template to determine that the products from the one or more different manufacturing lines have a common parametric footprint with the product template;
   qualifying the products from the one or more manufacturing lines which meet the allowed parametric match, and
   re-centering manufacturing process for the products from the one or more manufacturing lines which do not meet the allowed parametric match until the products from the one or more manufacturing lines meet the allowed parametric match.

2. The method of claim 1, wherein the establishing a product template comprises:
   placing the product macros on a chip and in a scribe line of the product template;
   establishing an estimate correlation line between measurements taken during a manufacturing process and measurements taken on a final product; and
   determining that the estimate correlation line intersects specification limit corners.

3. The method of claim 2, wherein the estimate correlation line is a regression line analysis between scribe line measurements and final product measurements.

4. The method of claim 3, wherein:
   a range enclosed by scribe line specification limits defines an acceptable scribe line range;
   a range enclosed by product specification limits defines an acceptable product range;
   intersections between the scribe line specification limits and the product specification limits define specification limit corners; and
   the manufacturing process is re-centered when the estimate correlation line does not intersect the specification limit corners.

5. The method of claim 2, wherein the product macros placed on the chip and in the scribe line of the product template comprise:
   one or more edge performance screen ring oscillators (PSROs) placed on the chip and a PSRO placed in the scribe line;
   a plurality of distributed PSROs placed on the chip and a distributed PSRO placed in the scribe line;
   a statistical process monitor (SPM) placed on the chip and a SPM placed in the scribe line; and
   manufacturing structures placed in the scribe line.

6. The method of claim 5, wherein the plurality of distributed PSROs on the chip and the distributed PSRO in the scribe line are used to take measurements during the manufacturing process and on the final product.

7. The method of claim 6, wherein:
   at least one of a range of values for the measurements of the plurality of distributed PSROs is established and an average value for the measurements of the plurality of distributed PSROs is determined; and
   a correlation is made between measurement points in the manufacturing line and at least one of the range and the average value.

8. A method, comprising:
   establishing a product template by correlating measurements taken during a manufacturing process with final product measurements;
   producing products on one or more different manufacturing lines, the products including product macros placed on a chip;
   establishing allowed parametric match from line to line which includes at least one of a design manual allowed mismatch, a scribe line to die allowed mismatch, and line to line allowed mismatch;
   determining that products from the one or more different manufacturing lines meet the allowed parametric match by comparing a parametric footprint of macros placed on the product template with the products from the one or more different manufacturing to determine that the products from the different manufacturing lines have a common parametric footprint with the product template;

qualifying the products from the one or more manufacturing lines which meet the allowed parametric match, and re-centering a manufacturing process of the one or more different manufacturing lines when the allowed parametric match is not met; and repeating the establishing, determining and re-centering steps until the products from the one or more different manufacturing lines meet the allowed parametric match.

9. The method of claim 8, wherein the determining that products from the one or more different manufacturing lines meet the allowed parametric match comprises comparing macros placed on the chip of the one or more different manufacturing lines to macros placed on the chip of the product template, and the products from different manufacturing lines of the one or more different manufacturing lines are qualified based on the product template from a first manufacturing line of the one or more different manufacturing lines by comparing the products manufactured on the different manufacturing lines with the product template, and determining that the products manufactured on the different manufacturing lines have a common parametric footprint using macros.

10. The method of claim 9, wherein the establishing the product template comprises:
    embedding product macros on a chip and in a scribe line of the product template;
    creating specification limits for product measurements and scribe line measurements;
    measuring the product macros at product test points and one or more manufacturing line test points;
    determining an estimate correlation line based on the measurements taken at the product test points and the one or more manufacturing line test points; and
    re-centering the estimate correlation line between the specification limits for the product measurements and scribe line measurements.

11. The method of claim 10, wherein the estimate correlation line is a regression line analysis between the scribe line measurements and the product measurements.

12. The method of claim 10, wherein the estimate correlation line is an overlay of identification specification limits for the scribe line measurements and the products measurements.

13. The method of claim 9, wherein:
    a range enclosed by scribe line specification limits defines an acceptable scribe line range;
    a range enclosed by product specification limits defines an acceptable product range; and
    intersections between the scribe line specification limits and the product specification limits define specification limit corners.

14. A computer system for qualifying multiple manufacturing lines, the system comprising:
    a CPU, a computer readable memory and a non-transitory computer readable storage media;
    first program instructions to establish a product template created from product disposition measurements made on a product in a first manufacturing line and which qualifies products manufactured in one or more different manufacturing lines;
    second program instructions to manufacture products on the one or more different manufacturing lines;
    third program instructions to establish allowed parametric match from line to line which includes at least one of a design manual allowed mismatch, a scribe line to die allowed mismatch, and line to line allowed mismatch;
    fourth program instructions to determine that products from the one or more different manufacturing lines meet the allowed parametric match by taking measurements from the products manufactured on the one or more manufacturing lines and comparing with macros laced on the product template to determine that the products from the one or more different manufacturing lines have a common parametric footprint with the product template;
    fifth program instructions to qualify the products from the one or more manufacturing lines which meet the allowed parametric match, and
    sixth program instructions to re-centering manufacturing process for the products from the one or more manufacturing lines which do not meet the allowed parametric match until the products from the one or more manufacturing lines meet the allowed parametric match,
    wherein the first-sixth program instructions are stored on the non-transitory computer readable storage media for execution by the CPU via the computer readable memory.

15. The computer system of claim 14, wherein the establishing a product template comprises:
    measuring product macros placed on a chip and in a scribe line of the product template;
    determining an estimate correlation line between measurements taken in the scribe line of the product template and measurements taken in a final product of the product template; and
    re-centering the estimate correlation line between specification limits for final product measurements and scribe line measurements, wherein the re-centering the estimate correlation lines comprises adjusting a manufacturing process or a design model.

16. The computer system of claim 14, wherein determining that products from the one or more manufacturing lines meet the allowed parametric match comprises comparing product macros placed on the chip of the one or more manufacturing lines to the product macros placed on the chip of the product template.

17. The system of claim 14, wherein:
    the estimate correlation line is a regression line analysis between the scribe line measurements and the final product measurements and an overlay of identification specification limits for the scribe line measurements and the final products measurements;
    a range enclosed by scribe line specification limits defines an acceptable scribe line range;
    a range enclosed by product specification limits defines an acceptable product range; and
    intersections between the scribe line specification limits and the product specification limits define specification limit corners.

* * * * *